United States Patent
Jin et al.

(10) Patent No.: US 7,418,356 B2
(45) Date of Patent: Aug. 26, 2008

(54) SYSTEM AND METHOD OF BATTERY CAPACITY ESTIMATION

(75) Inventors: Xin Jin, Nepean (CA); Calin N. Bugnariu, Ottawa (CA); M. Khaledul Islam, Nepean (CA); Samir R. Shah, Burnaby (CA); Stephen L. Pomeroy, Nepean (CA); Reguina Bouianovskaia, Nepean (CA); Junhong Nie, San Diego, CA (US)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 10/668,763

(22) Filed: Sep. 23, 2003

(65) Prior Publication Data
US 2004/0117137 A1    Jun. 17, 2004

Related U.S. Application Data

(60) Provisional application No. 60/412,774, filed on Sep. 24, 2002.

(51) Int. Cl.
*G06F 19/00* (2006.01)
(52) U.S. Cl. .................................... 702/63
(58) Field of Classification Search ............... 702/63; 320/132, 130, 106, 134, 136, 113, 127; 701/35, 701/1; 340/636, 636.1; 396/277; 324/427, 324/429, 771, 433, 425; 201/213; 429/7; 348/372, 231; 700/292
See application file for complete search history.

(56) References Cited

U.S. PATENT DOCUMENTS

| | | | |
|---|---|---|---|
| 4,297,639 A | * | 10/1981 | Branham ............ 324/429 |
| 4,390,841 A | | 6/1983 | Martin et al. |
| 5,596,260 A | | 1/1997 | Moravec et al. |
| 5,600,230 A | | 2/1997 | Dunstan |
| 5,606,242 A | | 2/1997 | Hull et al. |
| 5,606,243 A | | 2/1997 | Sakai et al. |
| 5,796,239 A | | 8/1998 | van Phuoc et al. |
| 5,847,566 A | | 12/1998 | Marritt et al. |

(Continued)

FOREIGN PATENT DOCUMENTS

JP    07-241039    *    9/1995

(Continued)

OTHER PUBLICATIONS

European Search Report, issued Nov. 24, 2006, for European Application No. EP0375025.

*Primary Examiner*—Tung S Lau
(74) *Attorney, Agent, or Firm*—Jones Day; Krishna K. Pathiyal; Robert C. Liang

(57) ABSTRACT

In accordance with the teachings described herein, systems and methods are provided for battery capacity estimation. A profile table may be used that relates a plurality of battery profile values with a plurality of operating parameter values. The profile table may be accessed to translate one or more measured operating parameters into one or more corresponding battery profile values. One or more of the battery profile values may be adjusted by a correction factor to generate a corrected battery profile value. The available capacity of the battery may be calculated using the corrected battery profile value. The correction factor may then be automatically calibrated by using an estimated battery profile value calculated from the one or more measured operating parameter.

34 Claims, 9 Drawing Sheets

U.S. PATENT DOCUMENTS

| | | | |
|---|---|---|---|
| 5,903,856 A * | 5/1999 | Rompe | 702/176 |
| 5,912,544 A | 6/1999 | Miyakawa et al. | |
| 5,949,219 A * | 9/1999 | Weiss | 320/136 |
| 6,025,695 A | 2/2000 | Friel et al. | |
| 6,160,380 A * | 12/2000 | Tsuji et al. | 320/132 |
| 6,198,254 B1 * | 3/2001 | Satake et al. | 320/132 |
| 6,748,273 B1 | 6/2004 | Obel et al. | |

FOREIGN PATENT DOCUMENTS

| | | |
|---|---|---|
| JP | 7-241039 A | 9/1995 |
| JP | 07241039 | 9/1995 |
| JP | 2001-330654 * | 11/2001 |
| JP | 2001-330654 A | 11/2001 |
| JP | 2002320336 | 10/2002 |
| WO | 9924842 | 5/1999 |
| WO | WO99/24842 A1 | 5/1999 |

* cited by examiner

SYSTEM AND METHOD OF BATTERY CAPACITY ESTIMATION

CROSS-REFERENCE TO RELATED APPLICATION

This application claims the benefit of U.S. Provisional Application Ser. No. 60/412,744, filed on Sep. 24, 2002, the entire disclosure of which is incorporated herein by reference.

FIELD

The technology described in this patent document relates generally to the field of battery-powered devices. More particularly, this patent document relates to techniques of battery capacity estimation.

BACKGROUND

Mobile communication devices, such as cellular telephones, two-way pagers and others typically rely on power from batteries. It is, therefore, advantageous for a mobile communication device to monitor the amount of time remaining before the device loses power due to a drained battery. For example, a mobile communication device may issue a warning signal during a call to avoid an imminent shut-off when the battery output drops below a particular threshold. Typical cellular service provides a three to five minute low-battery warning period during a call and similar warnings when the device is idle.

Mobile communication devices typically measure battery capacity in units of current multiplied by time, such as milliamp hours (mAh). However, direct current measurement may not be available in certain devices. In addition, the variation of battery parameters, such as temperature, equivalent series resistance (ESR), and aging, often make it difficult for a device to perform an accurate prediction. The multi-mode operations available in some devices (e.g., sleep, wake-up, access, traffic) may make this estimation even more difficult.

SUMMARY

Systems and methods are provided for battery capacity estimation. A profile table may be used that relates a plurality of battery profile values with a plurality of operating parameter values. The profile table may be accessed to translate one or more measured operating parameters into one or more corresponding battery profile values. One or more of the battery profile values may be adjusted by a correction factor to generate a corrected battery profile value. The available capacity of the battery may be calculated using the corrected battery profile value. The correction factor may then be automatically calibrated using an estimated battery profile value calculated from the one or more measured operating parameters. In addition, the following method steps may be performed. Determining an equivalent series resistance value for the battery. Determining a load voltage value for the battery. Determining a load current value for the battery. Determining the unloaded voltage value as a function of the equivalent series resistance value, the load voltage value, and the load current value.

DETAILED DESCRIPTION

Figure 1:
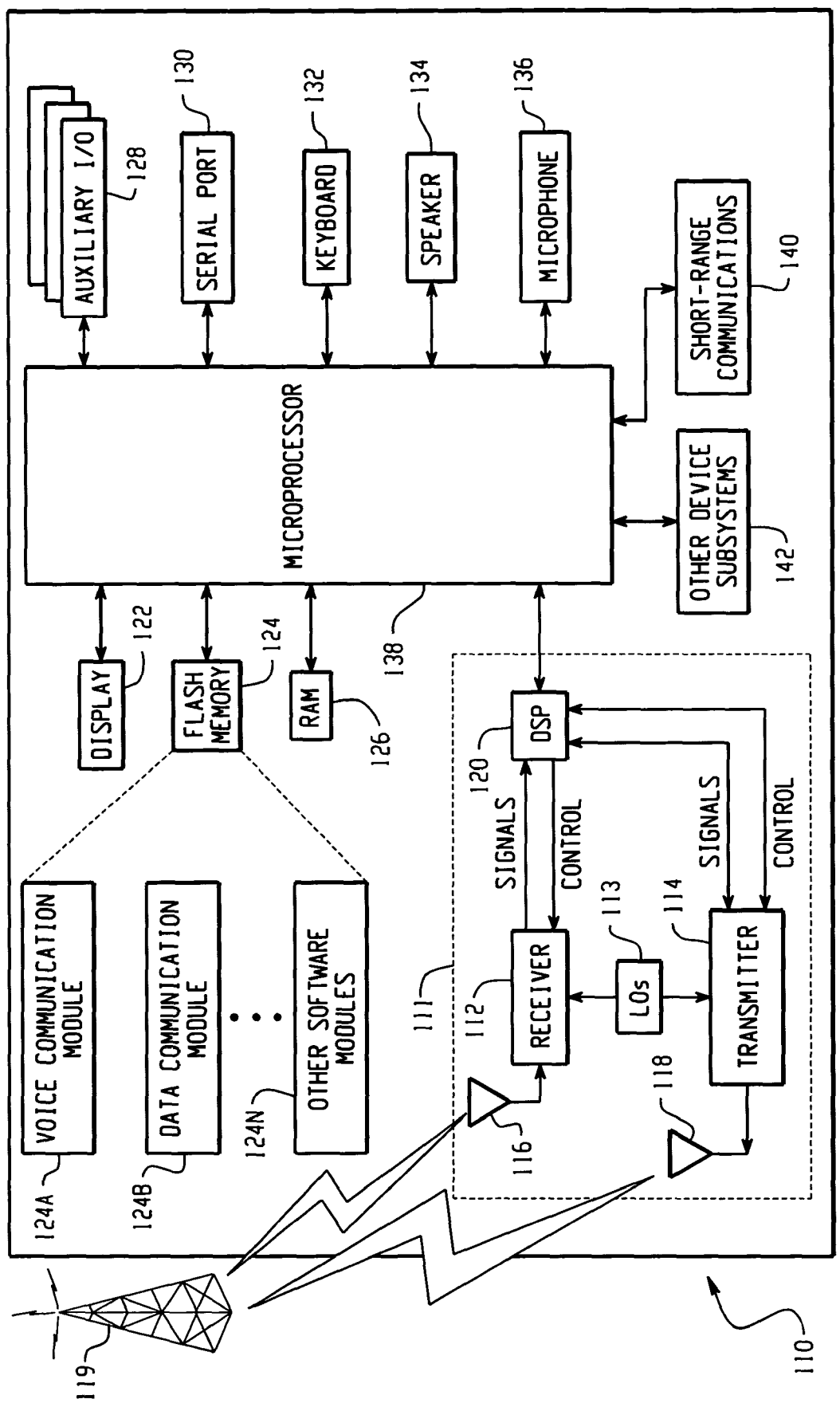
FIG. 1 is a block diagram of an example mobile communication device.

FIG. 1 is a block diagram of an example mobile communication device 110. The mobile communication device 110 includes a transceiver 111 for communicating data signals with a base station antenna 119. The data signals may be voice, information at different data rates, or other types of signals, both digital and analog.

The base station antenna 119 may be part of an analog or digital cellular network or some other type of data network. The voice and data networks may be separate communication networks using separate infrastructure, such as base stations or network controllers, or they may be integrated into a single wireless network.

In one embodiment, the transceiver 111 includes a receiver 112, a transmitter 114, one or more local oscillators 113, a digital signal processor (DSP) 120, and transmit and receive antennas 116, 118. In another embodiment, the transceiver uses a single antenna to which the transmitter and receiver are diplexed.

The DSP 120 sends and receives data signals to and from the transmitter 114 and receiver 112. The DSP 120 also receives control information from the transmitter 114 and the receiver 112 and provides control information to the transmitter 114 and the receiver 112.

A single local oscillator 113 may be used in conjunction with the transmitter 114 and receiver 112 if the voice and data communications occur at a single frequency or a closely spaced set of frequencies. Alternatively, if different frequencies are utilized for voice communications versus data communications, then a plurality of local oscillators 113 can be used to generate multiple frequencies corresponding to the voice and data networks 119.

A microprocessor 138 controls the operation of the mobile device 110. It should be understood, however, that other embodiments may include micro-controllers, DSPs, or other types of processing devices. A display 122 (e.g., LCD, LED) provides the microprocessor with the ability to display information to a user.

The mobile communication device 110 has memory for temporarily and/or permanently storing data. The memory includes flash memory 124 and random access memory (RAM) 126, but could include other types of memory, such as semiconductor memory (e.g., ROM), magnetic, optical or others. The memory can be used to store data, such as the mobile device's operating system, operational data, user preferences, temporary data from the microprocessor 138, or other types of data.

In one embodiment, the flash memory 124 stores a plurality of software application modules 124A–124N that can be executed by the microprocessor 138, the DSP 120, and/or another processing device. The application modules include a voice communication module 124A, a data communication module 124B, and a plurality of other operational modules 124N for carrying out other functions. The battery capacity estimation program described herein may, for example, be stored in the flash memory 124, but could be stored in other permanent memory (e.g., ROM) in the mobile communication device 110.

Additional application modules 124N may be loaded onto the device 110 through the network 119, through an auxiliary I/O subsystem 128, through the serial port 130, through the short-range communications subsystem 140, or through another suitable subsystem 142, and installed by a user in the Flash memory 124 or RAM 126. Such flexibility in application installation increases the functionality of the device 110 and may provide enhanced on-device functions, communication-related functions, or both. For example, various parameters and/or steps of the battery capacity estimation program, described below, may be updated in this manner.

The mobile device includes auxiliary input/output (I/O) devices 128, a serial port and/or a USB 130, a keyboard 132, a speaker 134, and a microphone 136 to enable access to the operation of the device.

A short-range wireless communications sub-system 140 and other device sub-systems 142, are also included in the mobile communication device 110. The short-range communications subsystem 140 may include an infrared device and associated circuits and components, or a BLUETOOTH short-range wireless communication module to provide communication with similarly enabled systems and devices. Other device sub-systems 142 may include battery condition measurement circuitry, as described below.

Figure 2:
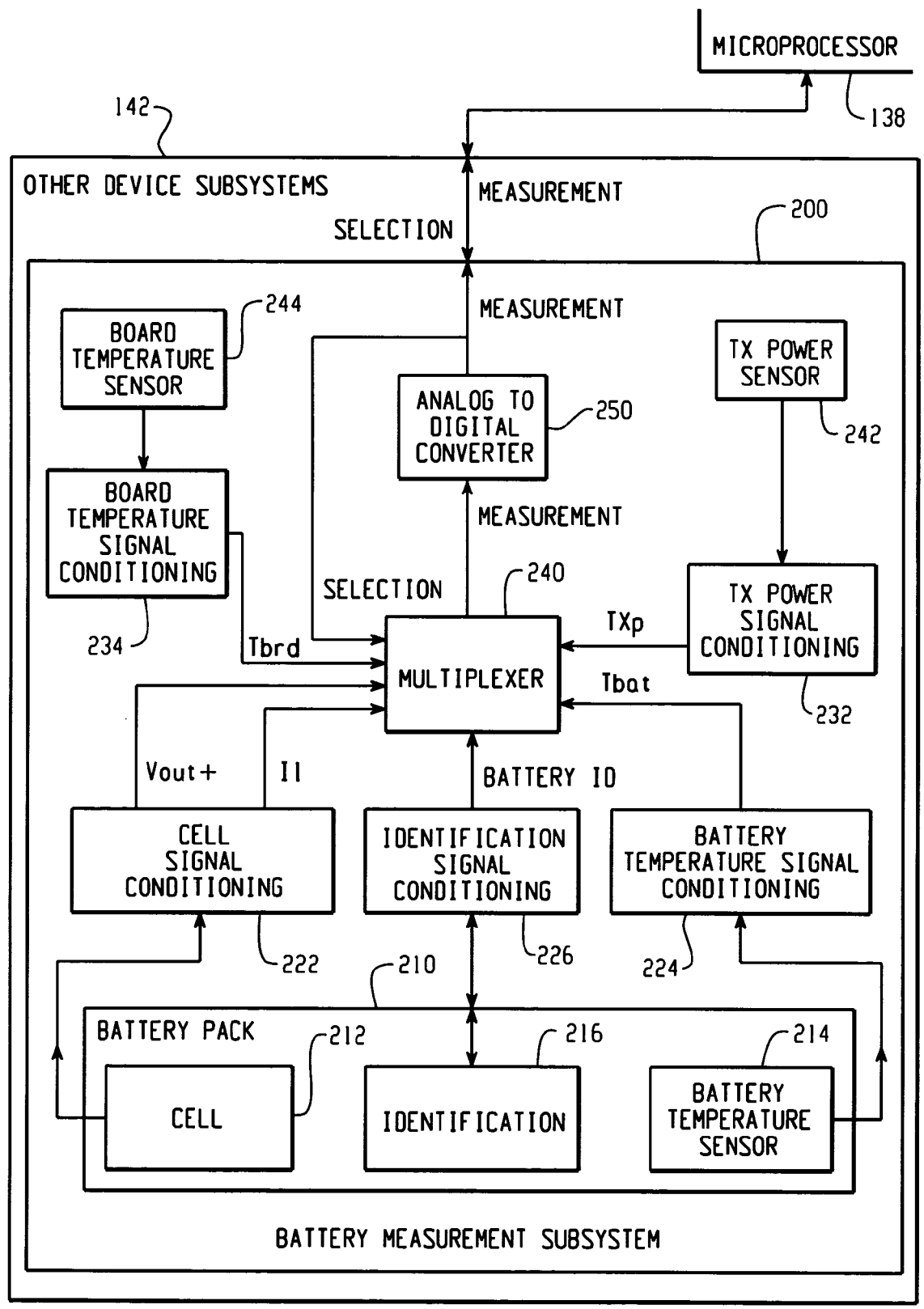
FIG. 2 is an example battery measurement subsystem for a mobile communication device.

FIG. 2 illustrates an example battery measurement subsystem 200 for a mobile communication device. The battery measurement subsystem 200 may, for example, be one of the other device subsystems 142 illustrated in FIG. 1.

The battery measurement subsystem 200 may receive a selection command from the microprocessor 138 and send a measurement value (i.e., a value indicating the battery state) to the microprocessor 138 in response to the selection command.

The battery measurement subsystem 200 includes a battery pack 210 that powers the mobile device 110 of FIG. 1. The battery pack 210 includes a cell 212, a battery temperature sensor 214, and an identification block 216. The identification block 216 may enable the microprocessor 138 to determine the type of battery 210.

The battery temperature sensor 214 provides a battery temperature signal that indicates the temperature of the battery pack 210. The battery temperature signal is conditioned by the battery temperature signal conditioning block 224 to generate the signal Tbat. The signal conditioning block 224 performs typical conditioning functions, such as filtering, scaling and/or amplifying. The signal conditioning block 224 may also perform other functions, such as providing bias required by the identification unit 216, multiplexer 240 and/or the analog to digital converter 250. The Tbat signal is coupled to an input of the multiplexer 240 for selection by the microprocessor 138.

The voltage and current of the cell 212 is monitored by the cell signal conditioning block 222. The cell signal conditioning block 222 provides a conditioned battery voltage signal, Vout+, and a conditioned battery current signal, I1, to the inputs of the multiplexer 240 for selection by the microprocessor 138.

In one alternate embodiment, the cell signal conditioning block 222 may not provide a battery current. In this case, the current may be obtained indirectly by measuring TX power and by detecting other device states that affect current, such as operation of backlight, buzzer and LED (within the other devices subsystem 142), as described below.

The TX power sensor 242 detects the transmit power of the transmitter 114 (FIG. 1), and inputs the transmit power to the TX power signal conditioning block 232. The TX power conditioning block 232 performs typical conditioning functions, such as filtering, scaling or amplifying, as well as providing a bias that may be required by the Tx power sensor 242, multiplexer 240 and/or the analog to digital converter 250. The Tx power conditioning block 232 generates the TXp signal that is coupled to the multiplexer 240 for selection by the microprocessor 138.

The incremental current consumption of the additional devices, such as backlight, buzzer and LED within the other devices subsystem 142, are pre-characterized and their values are stored in flash memory 124 according to the states of these devices. The software that runs on the microprocessor 138 controls the operation of these device states and, therefore, the states can be detected and corresponding incremental current consumptions by these devices can be included in the processing.

A board temperature sensor 244 provides a board temperature signal, Tbrd, that indicates the temperature of the printed circuit board of the transceiver 111 of FIG. 1. This signal is conditioned by the board temperature signal conditioning block 234 and coupled to an input of the multiplexer 240.

The identification block 216, provides the identification signal Battery ID that is conditioned by the identification signal conditioning block 226 and input to the multiplexer 240.

In operation, multiplexer 240 responds to the selection signal sent by the microprocessor 138 to drive a select measurement signal such as: Tbrd, Vout+, I1, TXp, Tbat or the battery ID, through the analog to digital converter 250. The analog to digital converter 250 digitizes the signal output from the multiplexer 240 and sends the digital representation of the measurement value to the microprocessor 138. For example, if the microprocessor 138 requests a battery ID, a predetermined selection command assigned to the battery ID is transmitted to the multiplexer 240 of the battery measurement subsystem 200. The multiplexer 240 may use this command to switch the battery ID input to the output of the subsystem 200.

Figure 3:
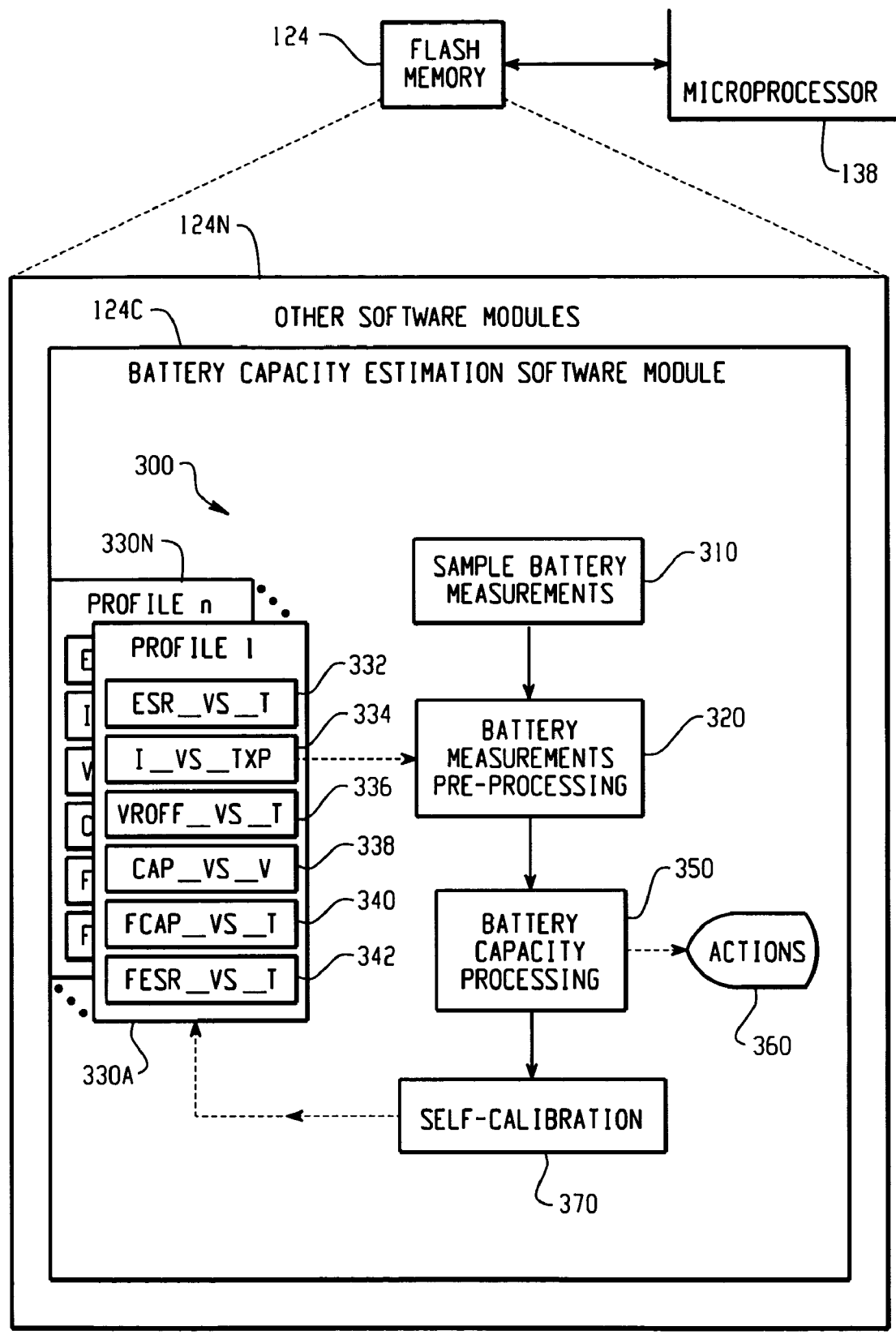
FIG. 3 is a flowchart of an example battery capacity processing method.

FIG. 3 includes a flowchart of an example battery capacity estimation method. A program for performing this method may, for example, be included in one of the software modules 124N illustrated in FIG. 1.

The illustrated other software module block 124N includes a battery capacity estimation software module 124C. The battery capacity estimation software module 124C is illustrated by flowchart 300. Also shown are multiple battery profiles 330A–330N that are stored with the software module 124C in flash memory 124, as well as pre-determined actions 360 that can be triggered by the battery capacity estimation software module 124C.

Battery profiles 1–N (330A–330N) support up to N battery packs 210 that a user may plug in and use on the mobile unit 110. Each battery profile 330A–330N identifies a given battery pack. In other words, for a specific battery pack 210 there corresponds a specific battery profile 330.

As described below, values of some of the tables in the profiles 330A–330N are dependent on the maker/model/version/batch of the battery pack, their values are determined at the time of battery manufacture and are loaded into the corresponding tables in 330A–330N. Values of other tables in the profiles 330A–330N are specific to a battery pack. A further description of these values is provided below.

Each battery profile 330A–330N may include multiple tables that profile a particular battery. These tables may include the Equivalent Series Resistance (ESR) versus battery temperature (Tbat) 332, the current (I1) versus transmit power (TXP) 334, the battery voltage threshold value at which the radio shuts off (VROFF) stored as a function of board temperature (Tbrd) 336, the battery capacity (CAP) as a function of unloaded voltage (V) 338, the battery capacity compensation factor at temperature Tbat 340, and the ESR compensation factor at temperature Tbat 342. This is illustrated as Profile 1 330A through Profile N of FIG. 3.

In another embodiment, I_VS_TXP and VROFF_VS_T may be determined by the transceiver and not the battery. In such an embodiment, these values may not be part of the battery profile.

In operation, at step 310 the method samples the battery measurements that include various operating parameters of the battery, such as temperature (T), loaded voltage (V_load), current (I1), and transmit power (TXp). When the method is used in co-operation with the subsystem of FIG. 2, this step may include instructing the microprocessor 138 to send at least one selection signal to the multiplexer 240 of the battery measurement subsystem 200. The microprocessor 138 then reads the selected measurement for each selection signal sent at the output of the analog to digital converter 250.

At step 320, the battery measurements sampled at step 310 are pre-processed to provide intermediate results used in the battery capacity processing step 350. In preprocessing, at least one of the multiple battery profiles 330A–N is used to translate the measurement to a corresponding value (e.g., temperature to resistance).

With reference to Profile 1 330A, the intermediate results from the pre-processing step 320 may include:

1) The ESR_VS_T 332A table translates the temperature to resistance through linear interpolation in the battery capacity estimation method. The table size may, for example, be eight elements that are equally spaced between −20° to 75° C., unsigned. This interpolation can be expressed by:

$$ESR(Tbat) = \text{Linear\_interpolate}(ESR\_VS\_T, Tbat);$$

where Linear_interpolate (ESR_VS_T, Tbat) represents the linear interpolation of the table ESR_VS_T at temperature Tbat.

The values stored in the table are the average values obtained by characterization of the battery pack upon manufacture.

2) The I_VS_TXP 334A table translates the transmit power to current through linear interpolation. This can be expressed by:

$$I(TXp) = \text{Linear\_interpolate}(I\_VS\_TXP, TXp);$$

where Linear_interpolate (I_VS_TXP, TXp) represents the linear interpolation of the table I_VS_TXP at transmit power TXp.

The values stored in the table are obtained by characterizing the current consumption of the entire device 110, which includes transmit power characteristics of the transceiver 111 of FIG. 1. This table translates the transmit power to current through linear interpolation. For example, the transmit power can be sensed by the transmit power sensor 242 of FIG. 2. Alternatively, the transmit power can be read from the transmit automatic gain control (AGC) or equivalent. Averaging of the translated current value can be used to obtain a more stable result. The battery current may further include other device consumptions, such as buzzer, backlight and LED, that are pre-characterized and stored in flash memory. The state of these devices detected by software running in the microprocessor 138 determines the value of the additional current.

In another embodiment, if current I1 is directly available via cell signal conditioning 222 of FIG. 2, then the table I_VS_TXP 334A and the above intermediate result may not be needed. In this case, battery current is obtained directly by measuring I1.

3) The VROFF_VS_T 336A table is made up of an array of the battery voltage threshold values at which the radio shuts off as a function of board temperature. In one embodiment, the elements are equally spaced over the temperature range of −20° to 75° C. The threshold value at a given temperature, Tbrd, is calculated by linear interpolation of the elements in the array. This interpolation can be expressed as:

$$V\_roff(Tbrd) = \text{Linear\_interpolate}(VROFF\_VS\_T, Tbrd);$$

where Linear_interpolate (VROFF_VS_T, Tbrd) represents the linear interpolation of the table VROFF_VS_T at board temperature Tbrd.

4) The loaded battery voltage is monitored periodically during a call and periodically during standby. During standby, the measured voltage may be treated as an unloaded voltage. During a call, the measured loaded voltage is translated to the unloaded voltage using the equation:

$$V = V\_load + I\_battery \cdot F\_esr(Tbat) \cdot ESR(Tbat);$$

where V is the translated unloaded voltage and V_load is the measured voltage during the call. In one embodiment, the measured voltage may be obtained by selecting the "Vout+" multiplexer 240 input provided by the cell signal conditioning block 222 of FIG. 2.

I_battery may be equal to I(TXp)+I(state), wherein I(TXp) is the translated current based on the table given in 2) above, and the I(state) is the total incremental current consumption of additional devices (such as buzzer, backlight and LED) that is pre-characterized and stored in a flash memory. The device state that determines I(state) may be detected by the software.

Alternatively I_battery may be obtained by selecting the "I1" multiplexer 240 input provided by the cell signal conditioning block 222 of FIG. 2. The V_load and I_battery may be measured effectively at the same time. ESR(Tbat) is the interpolated value obtained as described previously. F_esr(Tbat) is a self-calibrating correction factor at the temperature Tbat that is detailed below in relation to the self-calibration of stored values FESR_VS_T 342A in step 370. F_esr(Tbat)·ESR(Tbat) together represents the translated and corrected ESR.

During standby, V is the battery voltage value. This may be obtained by selecting the "Vout+" multiplexer 240 input provided by the cell signal conditioning block 222 of FIG. 2.

5) The battery capacity as a function of unloaded voltage may be characterized at manufacture and stored in the table CAP_VS_V 338A of FIG. 3 as elements that are equally spaced over a predetermined voltage range of 2.9000–4.5384V. The capacity at unloaded voltage V is obtained by linear interpolation by the equation:

$$C\_model(V) = \text{Linear\_interpolate}(CAP\_VS\_V, V);$$

where V is the unloaded battery voltage, obtained by the calculation given in 4) above and Linear_interpolate (CAP_VS_V, V) represents the linear interpolation of the table CAP_VS_V at voltage V.

The battery capacity processing 350 takes place using the intermediate results of the above-described preprocessing step 320. The battery capacity of the mobile device is estimated by:

$$C\_user(V, Tbat) = F\_cap(Tbat) \cdot C\_model(V);$$

where F_cap(Tbat) is a self-calibrating correction factor at the temperature Tbat that is detailed below in relation to the self-calibration of stored values FCAP_VS_V 340A in step 370.

Figure 12:
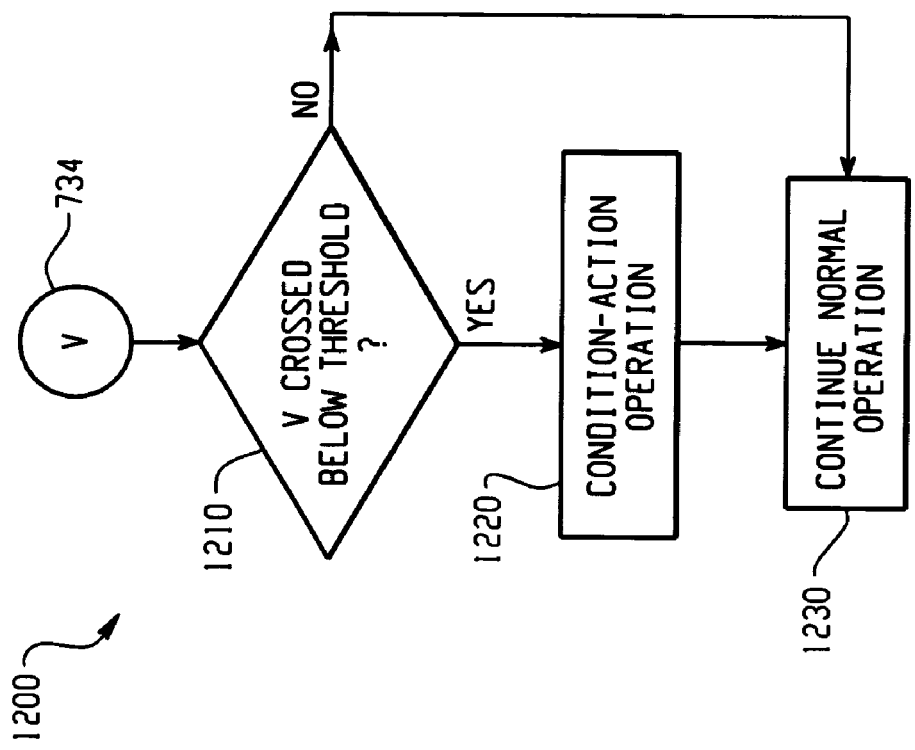
FIG. 12 is a flowchart illustrating an example of the actions step shown in FIG. 3.

Various predetermined actions 360 may result from triggers that are dependent on the value of the battery capacity processing 350. These actions 360 may, for example, include warning messages displayed on the mobile device's display and shutting off the mobile device. Each of the actions 360 may be triggered by different values of estimated battery capacity, or measured voltage. Alternate embodiments may have different actions for various values of estimated battery capacity. A flowchart illustrating one example action 360 is shown in FIG. 12, described below.

After the battery capacity processing step 350, self-calibration of the correction factors occur at step 370. Since the FCAP_VS_T or FESR_VS_T initial values represent an average, freshly manufactured battery when they work with the CAP_VS_V or ESR_VS_T respectively, these values should be corrected to account for effects, such as battery aging, differences between battery packs, or other errors. The self-calibration includes self-calibration of the correction factors F_esr(Tbat) and F_cap(Tbat) of step 350.

The battery capacity may be used to identify a need for charging the battery or as an indication of the amount of time before the battery is discharged. While the battery discharges, the device monitors the voltage. The first critical value, V_roff(Tbrd), is the one beyond which the radio ceases to perform within its specifications, and is dependant on temperature. Past the V_roff(Tbrd), the radio portion of the hardware is turned off.

Further discharge, with the radio off, may bring the device to a second threshold, V_dvoff. When V_dvoff is reached, the device shuts off.

If battery capacity is assumed to be a function of unloaded voltage, then a full capacity is achieved when the unloaded voltage reaches the maximum battery voltage. "Available capacity" assumes that a "0" capacity is reached when the loaded voltage equals V_dvoff. In order to make available capacity independent of device usage, a negligible current is assumed. "Assessible capacity" assumes that a "0" capacity is reached when the loaded voltage reaches V_roff(Tbrd) since the capacity is a function of unloaded voltage:

$$V\_roff\_unloaded(Tbrd) = V\_roff(Tbrd) + I\_battery \cdot F\_esr(Tbat) \cdot ESR(Tbat);$$

where I_battery is the current delivered by the battery at the time of the capacity estimation, ESR(Tbat) is the equivalent series resistance of the battery, and F_esr(Tbat) is a self-calibrating correction factor at the temperature Tbat required to fine tune the equivalent series resistance of the battery.

It can be seen that the "0" capacity varies with the F_esr(Tbat)·ESR(Tbat) and with the device current. Tbat is, "accessible capacity" represents a battery capacity that is based on current conditions.

When accessible capacity reaches "0", the device ceases to perform within its specifications and will shut down the radio portion of the hardware. The user can then refer to the available capacity to decide when to charge the device. The accessible capacity may be referred to in order to estimate how much more usage the user can get out of the device.

In contrast to the available capacity that gradually decreases while in-use and increases while in the charger, the accessible capacity is highly dependant on external factors such as temperature and RF conditions. Therefore, the capacity of a battery is determined in a best-case scenario: the least current draw at room temperature. The availability of battery capacity is determined with an operational current draw and at a current temperature.

Because of various types of batteries on the market, it may be desirable to display the battery capacity in percentages of the maximum battery capacity. Therefore, the display may be calculated as follows:

$$C\_available = (C\_user(V\_now) - C\_user(V\_dvoff)) / (C\_user(V\_charged) - C\_user(V\_dvoff));$$

$$C\_accessible = (C\_user(V\_now) - C\_user(V\_roff\_unload(Tbat))) / (C\_user(V\_charged) - C\_user(V\_dvoff));$$

where V_now is the current unloaded voltage. Because of the continuous current draw, V_now should be calculated from the measured voltage and from the battery current:

$$V\_now = V\_measured + I\_battery \cdot F\_esr(Tbat) \cdot ESR(Tbat).$$

V_roff_unloaded(Tbrd) is the radio off unloaded voltage:

$$V\_roff\_unloaded(Tbrd) = V\_roff(Tbrd) + I\_battery \cdot F\_esr(Tbat) \cdot ESR(Tbat).$$

V_measured is the measured voltage, I_battery is the current delivered by the battery measured simultaneously with V_measured, and V_charged is the voltage when the battery is fully charged. In one embodiment, V_charged is 4.2V. V_dvoff is the battery voltage when the device shuts off. In one embodiment, V_dvoff is 3.1V.

There can be different ways to display the available and the accessible capacity. One example is a battery picture. The available capacity may be displayed in gray. When the battery is charged, the battery picture will be completely filled. The accessible capacity may be displayed in black over the available capacity. Under ideal conditions, the two capacities will be close together with the accessible capacity slightly lower than the available capacity.

Messages to increase battery capacity may also be displayed. For example, if the radio is currently experiencing less than maximum received signal strength, a message could be displayed advising the user to move to another location to increase battery capacity. Similarly, if the measured temperature is lower than a predetermined temperature threshold (e.g., room temperature), a message could be displayed advising the user to warm the radio to increase capacity. Alternate embodiments use other criteria for determining when to display a message to increase battery capacity.

One embodiment of the ESR Estimation/Self-Calibration method is described subsequently as it relates to a mobile communication device capable of making and receiving radiotelephone or telephone calls. Alternate embodiments of this method include any mobile device that has a high use period and a stand-by state. The transmission period and stand-by state of a mobile communication device is only one such example.

An example of the ESR Estimation/Self-Calibration method illustrated in FIG. 3 is as follows. During a call, the temperature T, loaded voltage V_load, and current I_battery are periodically measured and stored, for instance in the RAM 126 of FIG. 1. After the call termination and before the temperature noticeably changes, the loaded voltage V is measured again. An estimation of ESR can then be calculated by the equation:

$$ESRestimated(Tbat)=(V\_idle-V\_load)/(I\_battery-Io);$$

where V_idle is the voltage measured after call termination, V_load is the latest voltage measurement before call termination, I_battery is the latest current measurement obtained at the same time as V_load, Io is a characterized value of current at idle state, stored (Io may be in a flash memory or, alternatively, may be approximated by value zero), and Tbat is the measured battery temperature.

In calculating ESRestimated(Tbat), the voltage and current should be measured effectively at the same time. Although the above description reads values into the microprocessor 138 sequentially, the voltage and current values can still be taken at the same time. For example, the cell signal conditioning 222 block may include a delay difference ΔT between the Vout+ branch and the I1 branch. When the selection signal commands the multiplexer 240, the commands between the voltage and current reading are separated by time difference ΔT. The same method can also be used between the cell signal conditioning 222 for voltage and TX power signal conditioning 232 for TXp to convert to I(TXp), as well as the I(state) for the states of other devices. Alternatively, one single command may be sent to sample and hold the voltage Vout+ and current I1 (or Tx power TXp) pair at cell signal conditioning 222 and TX power conditioning 232 at the same time instant. Yet another alternate is to design the signal conditioning blocks for voltage and current with the same delay, and utilize a two channel analog to digital converter to sample the voltage Vout+ and current I1 (or TXp) at the same time and fetch the values to the microprocessor 138 one after another.

The ESR can then be self-calibrated by defining the function F_esr(Tbat) as an ESR correction factor at temperature Tbat. The F_esr (Tbat) function may, for example, be stored in an array [F1, F2, ..., Fn], such as table FESR_VS_T. Each element of the array is the value of F_esr(T) at n temperatures T=T1, T2, ..., Tn, spanning a temperature range of interest.

The value of F_esr(Tbat) for temperature Tbat between any of the n temperature points is represented by the interpolated value of the adjacent element values. Initial values stored in table FESR_VS_T for F1, F2, ..., Fn are all 1.0's. The value of the entry in the table FESR_VS_T (342A) having a corresponding temperature that is closest to Tbat is updated by the value $F\_esr^{(new)}(Tbat)$, which may be calculated as follows:

$$F\_esr^{(new)}(Tbat)=F\_esr^{(old)}(Tbat)+\beta\cdot\{ESRestimated(Tbat)/ESR(Tbat)-F\_esr^{(old)}(Tbat)\};$$

where Tbat is the measured temperature, ESRestimated (Tbat) is generated as described above, ESR(Tbat) is interpolated from the table ESR_VS_T as described above, $F\_esr^{(old)}(Tbat)$ is the interpolated value from the table FESR_VS_T at temperature Tbat before the table is updated, and β is a small value that is used for iterative correction and may vary for each application.

Alternatively, the value in table FESR_VS_T may be reduced to only one element that is not a function of temperature, and corrections to ESR may be made using the single factor F_esr for any temperature. It should be understood, however, that using one factor to update the entire table is based on an approximation in which the "shape" of the characterized ESR does not noticeably change from device to device or by aging, but may proportionally vary. In this case, the following equations may be applied:

$$V=V\_load+I\_battery\cdot F\_esr\cdot ESR(Tbat);$$

$$F\_esr^{(new)}=F\_esr^{(old)}+\beta\cdot\{ESRestimated(Tbat)ESR(Tbat)-F\_esr^{(old)}\}$$

The self-calibrating correction factor F_cap(Tbat), as stated in reference to step 350 above, is used to correct the capacity model stored in table CAP_VS_V 338A. F_cap (Tbat) may be produced and updated as follows:

1) The function F_cap(Tbat) is a correction factor at temperature Tbat. This function is stored in an array form [F1, F2, ..., Fn], such as table FCAP_VS_T 340A, where each element is the value of F_cap(Tbat) at n temperatures Tbat=T1, T2, ..., Tn, spanning a predefined temperature range of interest. The value of F_cap (Tbat) for temperature Tbat between any of the n temperature points is represented by the interpolated value of the adjacent element values. Initial values stored in table FCAP_VS_T for F1, F2, ..., Fn are all 1.0's.

2) When a "battery low" warning message is given, the current I_battery is monitored periodically and more frequently at intervals of Δt. An accumulator accumulates the values of I_battery obtained at every interval Δt.

3) If the user does not terminate the call prior to the voltage dropping below a threshold, then the radio shut-off action occurs. This shut-off action is triggered by the first occurrence of V_load<V_roff(Tbrd). Otherwise, the user terminates the call after the battery low warning and before the radio shut off action is triggered. In either case, the following functions may be performed:

a) Stop the current accumulator at the time the radio is turned off (by user or automatically), obtain the last value of ΣI_battery, and calculate the actual capacity change during the period from the low battery warning to the radio shut off as: ΔC_actual=t·ΣI_battery;

b) Calculate the battery capacity model estimated capacity change before correction as: ΔC_est=C_model(V_warn)−Cmodel(V_idle); where V_warn is the unloaded voltage converted from loaded voltage at the time radio battery low warning message was issued; and V_idle is the unloaded voltage converted from the loaded voltage obtained after the radio is turned off (either by user or automatically);

c) Calculate the updated F_cap(Tbat) value at temperature Tbat as follows: $F\_cap^{(new)}(Tbat)=F\_cap^{(old)}(Tbat)+\alpha\cdot\{\Delta C\_actual/\Delta C\_est-F\_cap^{(old)}(Tbat)\}$; where α is a small constant for iterative correction; Tbat is the average temperature between the time issuing the battery low warning message and the time radio is turned off; and $F\_cap^{(old)}(Tbat)$ is the interpolated value on table FCAP_VS_T at the temperature Tbat before FCAP_VS_T is updated;

d) Update the element FCAP_VS_T(n) (340A) by the value $F\_cap^{(new)}(Tbat)$, where n is the closest element to temperature Tbat in the span of table FCAP_VS_T.

If the mobile device 110 has never been operated at a given temperature range, then the corresponding element of RESR_VS_T and/or FCAP_VS_T will have never been updated. Thus, the first time the method attempts to retrieve F_esr (Tbat) and/or F_cap(Tbat) in that range, the initial value of 1.0 may be inaccurate. If the neighboring elements to the F_cap(Tbat) value in table FCAP_VS_T and to the F_esr (Tbat) value in table FESR_VS_T are not equal to the initial value (1.0), additional processing can reduce the initial error. If only one suitable neighboring element is available at one side of F_esr(Tbat) or F_cap(Tbat) and it is significantly different from 1.0, then the neighbor value may be used for F_esr(Tbat) or F_cap(T) instead of 1.0, otherwise, the value 1.0 may be used. When there are two suitable neighboring values on either side of F_esr(Tbat) or F_cap(T), then a value may be interpolated using the neighboring values for F_esr (Tbat) or F_cap(T).

Alternatively, the table FCAP_VS_T may be reduced to only one element that is not a function of temperature, and corrections to CAP_VS_V may be made using only the single factor F_cap for any temperature. In this case, the following equations may be used:

$$C\_user(V) = F\_cap \cdot C\_model(V); \text{ and}$$

$$F\_cap^{(new)} = F\_cap^{(old)} + \alpha \cdot \{\Delta C\_actual/\Delta C\_est - F\_cap^{(old)}\}.$$

Figure 4:
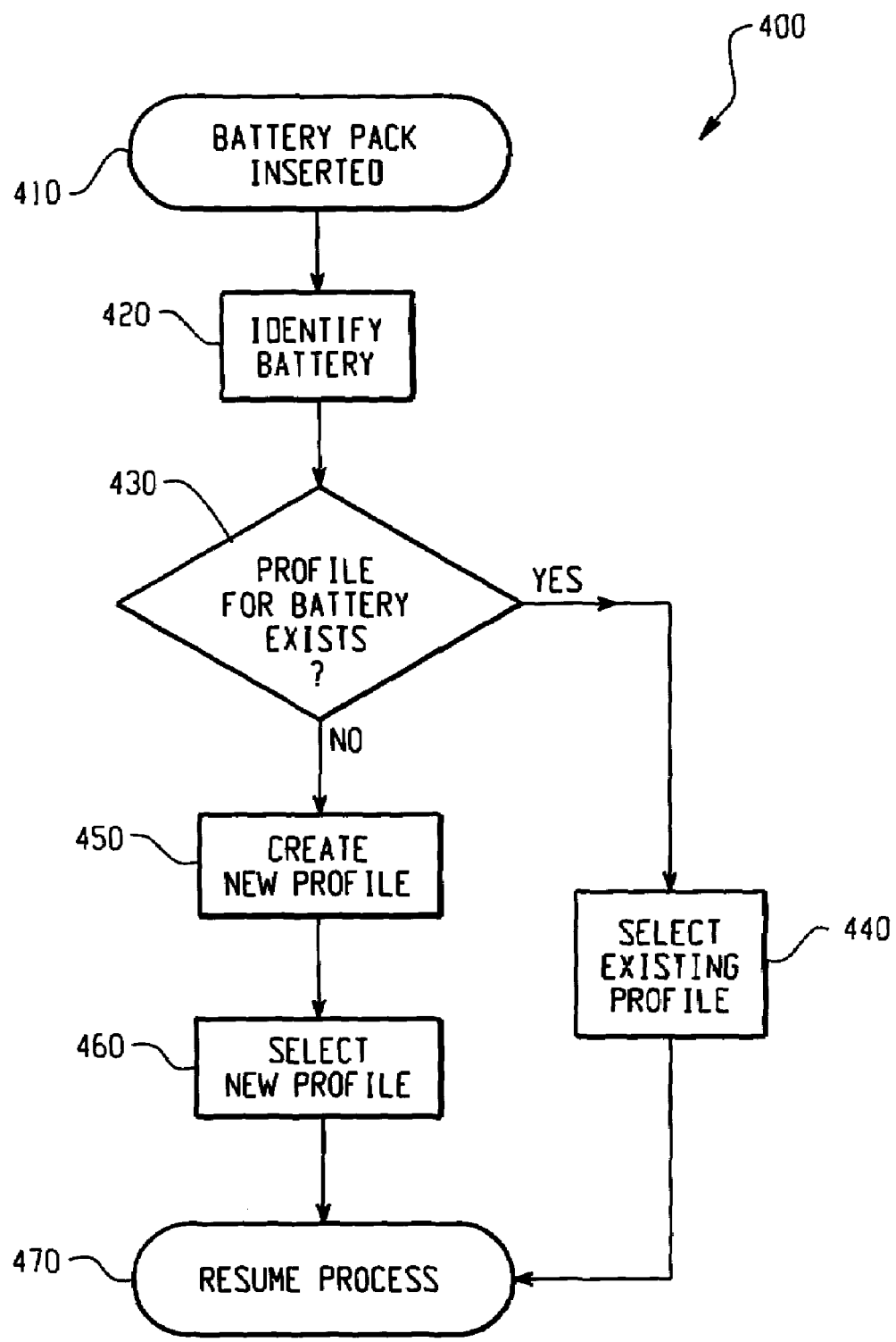
FIG. 4 is a flowchart of an example method for selecting a battery profile.

FIG. 4 is a flowchart of an example method 400 for selecting a battery profile. The method 400 is initiated when a battery pack, such as the battery pack 110 of FIG. 2, is inserted 410. The battery pack is identified at step 420. The identification may, for example, be performed by the identification module 116 of FIG. 2 or, alternatively, by measurement of a characteristic property of the battery pack, such the ESR.

In step 430, the method determines if a profile exists for the battery pack. If a profile is determined to exist, then the existing profile corresponding to the pack is selected at step 440 in response to the predetermined characteristic. Conversely, if no profile exists, then a new profile is created at step 450, as described above. This new profile is then selected at step 460. In either case, after the profile is selected, the process requesting the battery profile resumes at step 470. This method enables multiple profiles, such as profiles 230A-N illustrated in FIG. 3, to be used, each corresponding to one battery pack of the same type or different types.

Figure 5:
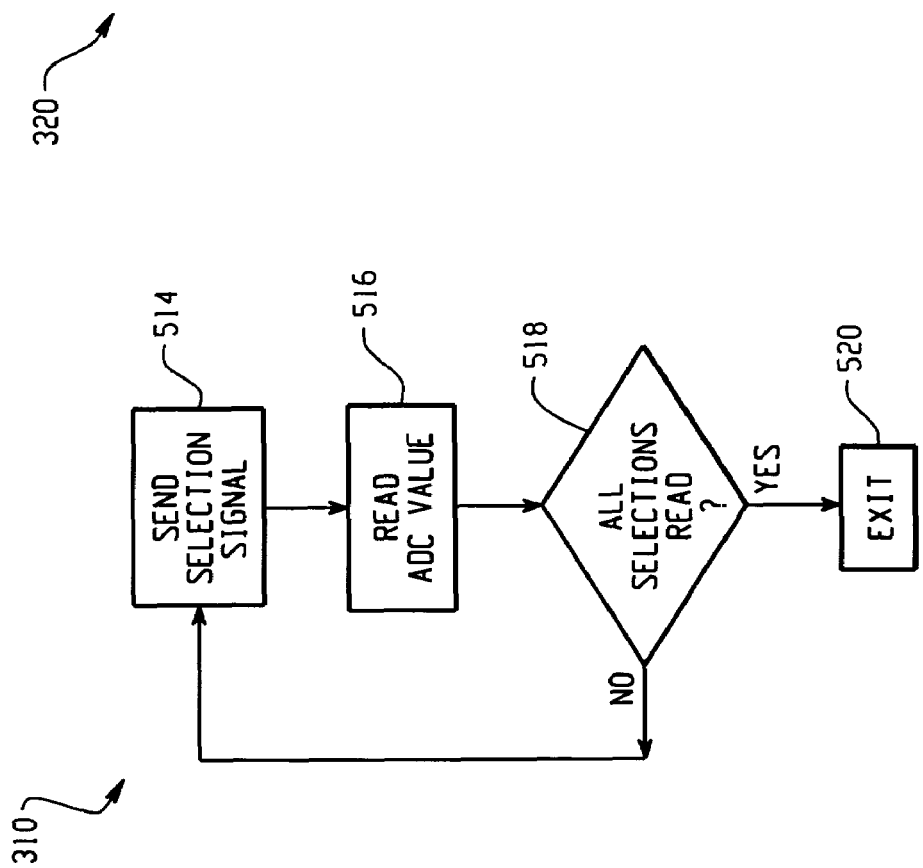
FIG. 5 is a flowchart illustrating an example method for sampling battery measurements.

FIG. 5 is a flowchart that illustrates a method of sampling battery measurements, as described with reference to step 310 of FIG. 3. At step 514, a selection signal, such as that illustrated connecting microprocessor 138 and ADC 250 in FIG. 2, is sent. The value of the measurement is obtained at step 516 by reading the value generated by the ADC. Step 516 determines if all measurements have been read. If not, then the method returns to step 514 with an unprocessed measurement. Otherwise, the method ends at step 520.

Figure 6:
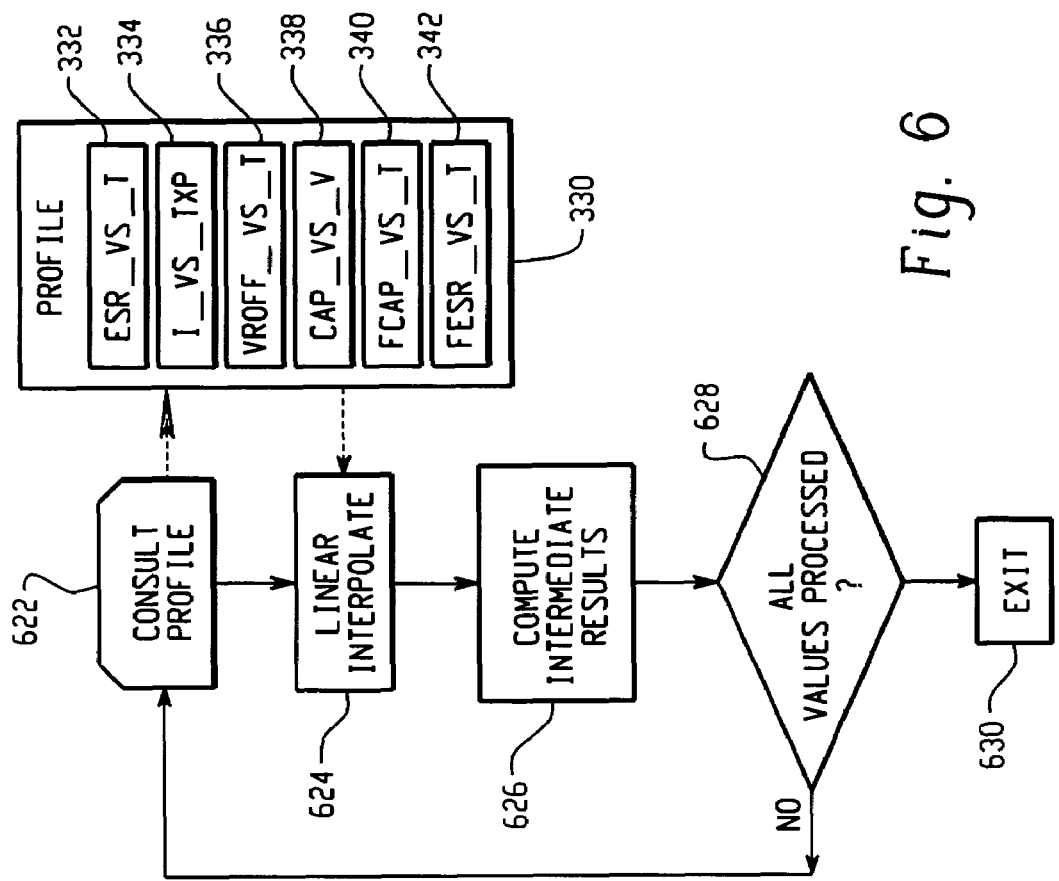
FIG. 6 is a flowchart illustrating an example method for battery measurement preprocessing.

FIG. 6 is a flowchart of an example preprocessing method, as described with reference to step 320 of FIG. 3. The battery profile 330 is consulted for a corresponding interpolation table for the ADC value in step 622. If found, the ADC value is interpolated using the corresponding table in step 624. The intermediate results are computed in step 626 based on the linearized measurements obtained from the previous step. Intermediate results, as well as processing results, are described below with reference to FIG. 7. At step 628, the method determines if all ADC values have been processed. If all ADC values have not been processed, then the method returns to step 622 with an unprocessed ADC value. Otherwise, the method ends at step 630.

Figure 7:
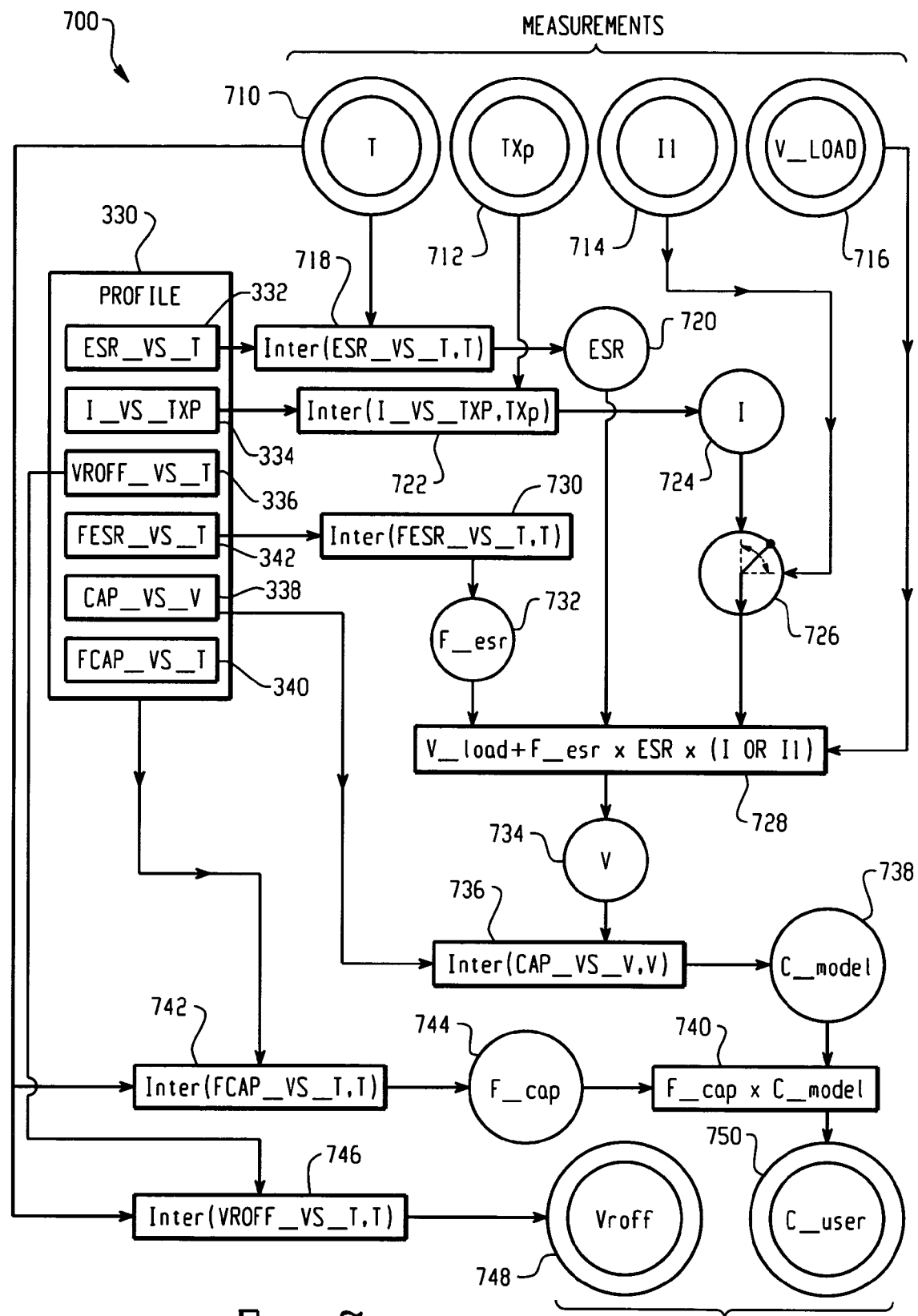
FIG. 7 is a flowchart illustrating example battery measurement, preprocessing, and capacity-processing methods.

FIG. 7 is a flowchart of an example method 700 for measurement, preprocessing, and capacity processing, as described above with reference to FIG. 3. Measurements obtained with the apparatus of FIG. 2 are illustrated by temperature T 710, transmit power TXp 712, measured current I1 714 and loaded battery voltage V_load 716. It should be understood, however, that although both TXp 712 and I1 714 are illustrated, only one may be required.

At step 718, the ESR_VS_T table 332 of profile 330 and T 710 are used to obtain the ESR 720 by interpolation. At step 722, the I_VS_TXP table 334 of profile 330 and TXp 712 are used to obtain the current I 724. The current I 724 further includes the I(state) that is determined by the state of other devices, such as a buzzer, backlight and LED. Alternatively, at step 726, if current I1 is available directly, then current I1 714 may be used instead of current I in subsequent processing steps.

At step 730, the FESR_VS_T table 342 of profile 330 and T 710 are used to obtain factor F_esr 732. Alternatively, F_esr may be a scalar that does not depend on temperature. At step 728, the ESR 720, F_esr 732 and either current I1 714 or current I 724 are used to obtain the unloaded voltage V 734 according to the equation V=V_load+F_esr·ESR·(I or I1), where (I or I1) signifies that either value of I or I1 can be used in the equation.

At step 736, the CAP_VS_V table 338 of profile 330 and V 734 are used to obtain a model capacity C_model 738 by interpolation.

At step 742, the FCAP_VS_T table 340 and T 710 are used to obtain factor F_cap 744 by interpolation. Alternatively, F_cap may be a scalar that does not depend on temperature. At step 740, F_cap 744 and C_model 738 are used to determine a capacity to show the user C_user 750, a first processing result.

At step 746, the table VROFF_VS_T 336 of profile 330 and T 710 are used to obtain the radio off threshold voltage VROFF 748, a second result, by interpolation. Note that in FIG. 7, Tbat and Tbrd are both represented by the same symbol T. Alternatively, step 746 may use Tbrd, and all other places use T (i.e., Tbat).

In one alternative embodiment, VROFF might be used instead of V at step 736 as an intermediate step to determine a condition for a capacity based condition-action operation. One such voltage based condition-action operation is described below with reference to FIG. 12.

Figure 8:
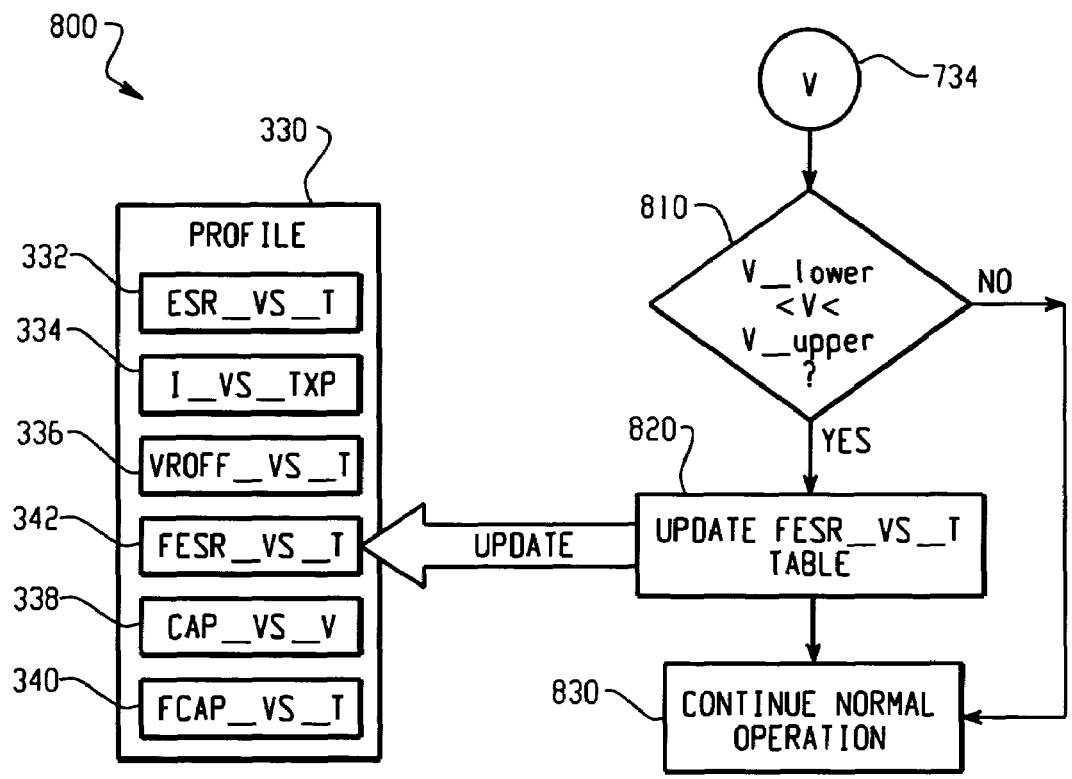
FIG. 8 is a flowchart illustrating an example self-calibration method.

FIG. 8 is a flowchart 800 of an example self-calibration method, as described above with reference to FIG. 3. This method 800 is a continuation of step 734 of FIG. 7.

The unloaded voltage V is compared at step 810 to an upper limit threshold, V_upper, and a lower limit threshold, V_lower. These limits may, for example, be two unloaded voltage thresholds that are determined based on the battery characterization. For example, V_upper may be 4.0V and V_lower may be 3.6V, but other threshold voltages could also be used.

If the voltage is within the threshold, then the FESR_VS_T table 342 is updated at step 820. The method of calibrating the FESR_VS_T table 342 is described in more detail with reference to FIG. 9. The normal operation of the mobile device then continues at step 830.

Figure 9:
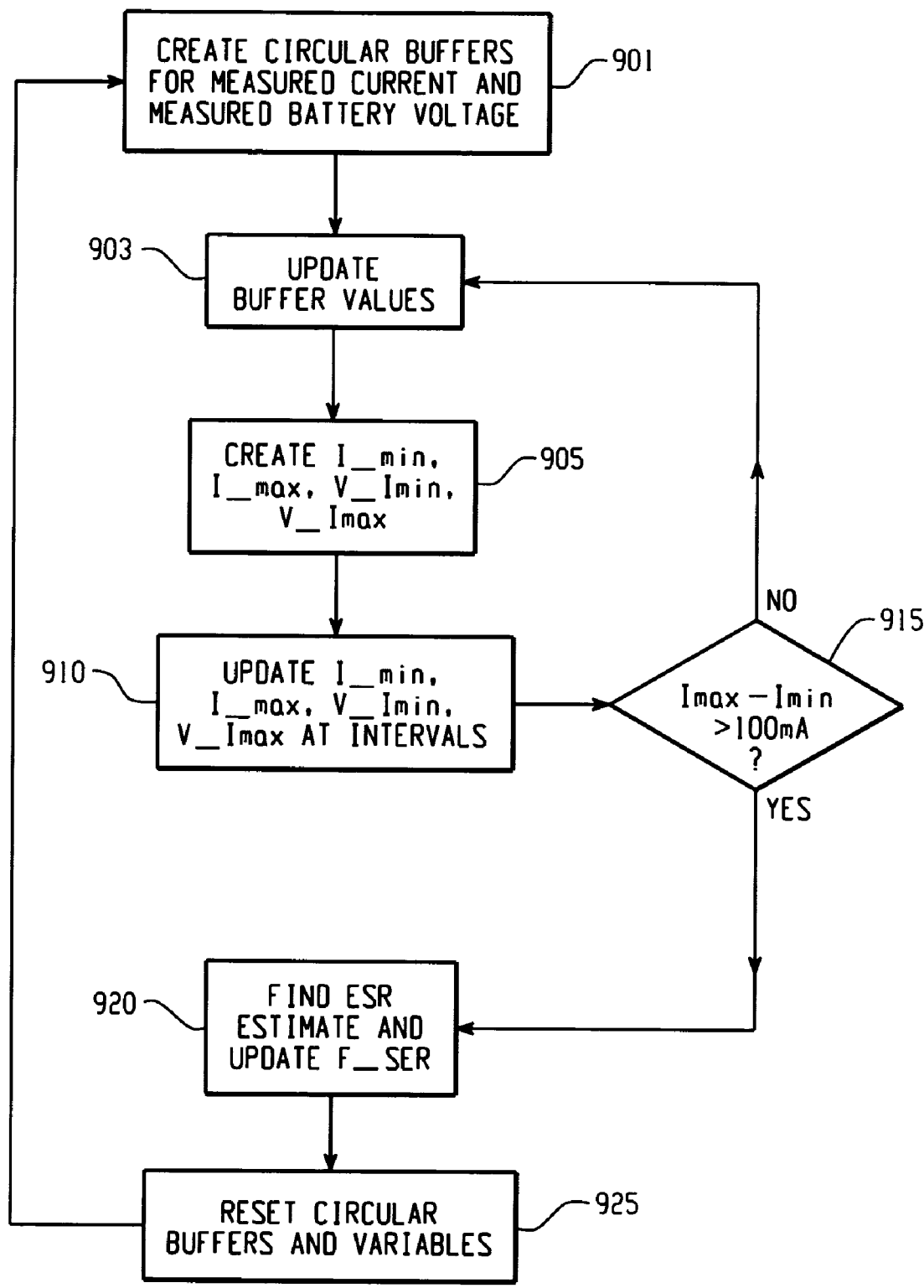
FIG. 9 is a flowchart illustrating an example method for the self-calibration of the ESR compensation factor in FIG. 8.

FIG. 9 is a flowchart of an example self-calibration method for the FESR_VS_T compensation factor described above with reference to FIG. 8. Two circular buffers are created at step 901. One buffer holds the measured current and the other holds the measured battery voltage. For example, each buffer may be 8 bytes long, but other sized buffers could also be used.

The values in the buffers are updated at predetermined intervals at step 903. One example of such an interval is every two seconds. The voltage and current samples are collected at substantially the same time and stored in the buffer as new values. The oldest values are discarded.

Variables are also created at step 905. These variables may include I_min, I_max, V_I_min, and V_Imax, where I_min is the minimum current value within the circular buffer for current after the last update with V_I_min being the voltage measured at substantially the same time as I_min. I_max is the maximum current value within the circular buffer for current after the last update, with V_Imax being the voltage measured at substantially the same time that I_max is measured. Alternatively, the current value may be obtained using a table that contains pre-measured current values based on the mobile device's state (e.g., transmit power high, stand-by mode, vibrator on) at each current value.

At step 910, the variables are updated at the same predetermined intervals as the values in the buffer (e.g., 2 seconds). If Imax−Imin is less than a predetermined threshold such as 100 mA, then the method returns to step 903 to update the buffer.

If Imax−Imin is greater than the predetermined threshold (e.g., 100 mA), then at step 920 the method finds the estimated ESR and updates the compensation factor for ESR in table FESR_VS_T. This step may be accomplished as follows:

$$ESRestimate(Tbat)=(V\_Imin-V\_Imax)/(I\_max-I\_min),$$

$$F\_esr^{(new)}(Tbat)=F\_esr^{(old)}(Tbat)+\beta\cdot\{ESRestimated(Tbat)/ESR(Tat)-F\_esr^{(old)}(Tbat)\};$$

where ESR(Tbat) is the interpolated value at current temperature Tbat (assuming that temperature change is small during 16 seconds) and β is a small constant in the range of 0.01–0.30. $F\_esr^{(old)}(Tbat)$ is the interpolated value from the table FESR_VS_T at temperature Tbat before the table is updated.

The value of the entry in the table FESR_VS_T (342A) of FIG. 3 with a corresponding temperature closest to Tbat is updated by the value $F\_esr^{(new)}(Tbat)$ as described above with respect to the array FESR_VS_T. Alternatively, the single element FESR may be updated by $F\_esr^{(new)}(Tbat)$, as described above.

The circular buffers and variables are reset at 925. The method then repeats from step 901.

Figure 10:
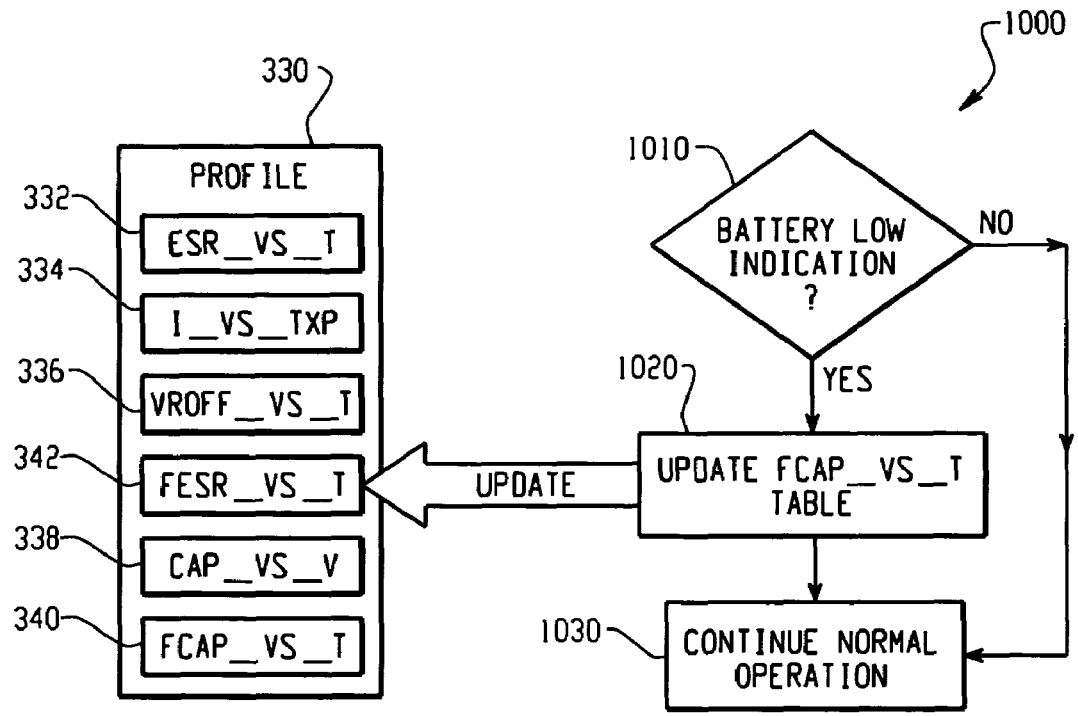
FIG. 10 is a flowchart illustrating another self-calibration method.

FIG. 10 is a flowchart of another example self-calibration method in accordance with FIG. 3. In this method 1000, if a battery low indication is detected at step 1010, then the FCAP_VS_T table 340 is updated at step 1020. The normal operation of the mobile device then continues at step 1030. A method of updating the FCAP_VS_T table 340 is illustrated in greater detail with reference to FIG. 11.

Figure 11:
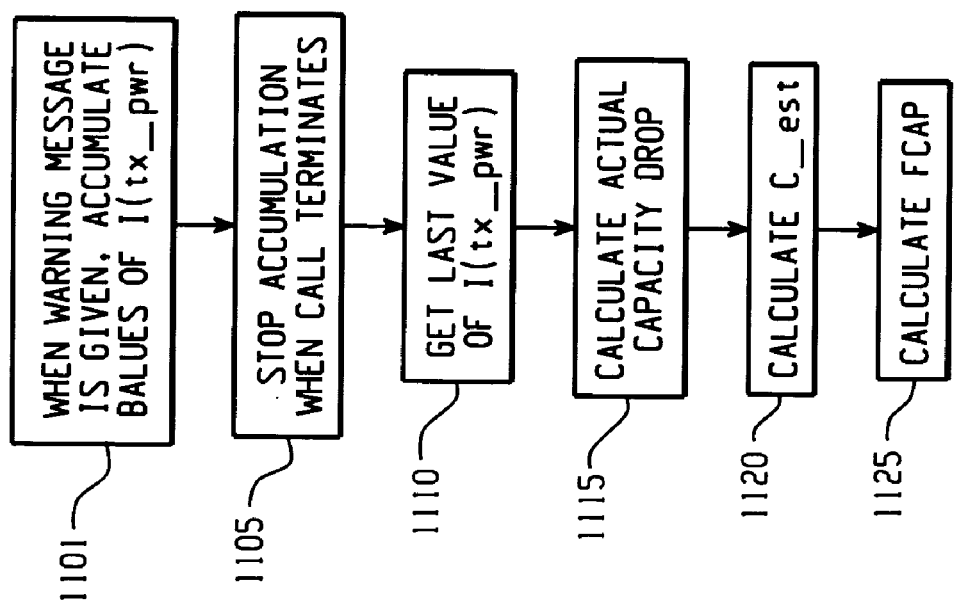
FIG. 11 is a flowchart illustrating an example method for the self-calibration of the capacity compensation factor in FIG. 10.

FIG. 11 is a flowchart of an example method for self-calibration of the compensation factor, FCAP_VS_T, as described with reference to FIG. 10. The method begins after a low battery warning message has been generated by the mobile device. An accumulator starts to accumulate values of I_battery at predefined intervals (e.g., 8 seconds) at step 1101.

After step 1101, two scenarios may occur. First, the mobile device user may not terminate the call or other high current application causing the mobile unit to shut off (i.e., the call terminates). Second, the user may terminate the call or other usage after the low battery warning message is given but before the mobile unit shuts off.

In any case, the accumulation stops at step 1105 when the call terminates. The last value of ΣI_battery is determined at step 1110, as described above, and the value is used to calculate the actual capacity drop at step 1115 using the following equation:

$$\Delta C\_actual=\Delta t\cdot\Sigma I\_battery.$$

The model estimated capacity drop before correction, C_est, is then determined at step 1120 using the equation:

$$\Delta C\_est=C\_model(V\_warn)-C\_model(V\_idle);$$

where V_warn is the unloaded voltage converted from the loaded voltage at the time the low battery warning message is issued and V_idle is the unloaded voltage converted from the loaded voltage obtained immediately after either user termination of the call or the radio shut-off event occurs.

The capacity calibration factor, F_cap, is calculated at step 1125 and the FCAP_VS_T updated, as described above.

FIG. 12 is a flowchart illustrating an example warning action during a call. This method 1000 may, for example, begin from step 734 of FIG. 7. A "battery low" warning message may be presented on the mobile unit display or by an aural tone in response to the first occurrence of the following event:

$$C\_user(V,Tbat)-C\_user(V\_ROFF\_unload,Tbat)<I\_battery\cdot t0;$$

where t0 is a predefined time advance before radio shut off (e.g., 4 minutes), V is the unloaded voltage translated from measured loaded voltage value described above with reference to step 320) in FIG. 3, Tbat is the measured temperature for battery, I_battery is the battery current calculated from the table of step 320 of FIG. 3, V_ROFF_unload is the unloaded voltage translated by loaded voltage threshold value calculated in step 320 of FIG. 3. The translation is given as:

$$V\_ROFF\_unload=V\_ROFF(Tbrd)+I\_battery\cdot F\_esr(Tbat)\cdot ESR(Tbat).$$

The method of FIG. 12 determines if the estimated battery capacity is less than the predetermined threshold at step 1210 (i.e., I_battery·t0). If the left hand side, determined by V, has not crossed below the threshold, then the mobile device's normal operation continues at step 1230. If the left hand side, determined by V, goes below the threshold at step 1210, then a series of condition-action operations are initiated at step 1220. The actions triggered at step 1220 include issuing a warning such as an audible beep and/or a message displayed on screen, and starting the FCAP_VS_T self calibration, as described above. The normal operation of the mobile device then continues at step 1230.

Additionally, a mobile device shut-off is triggered by the first occurrence of:

$$V\_load\_this\_time<V\_ROFF(Tbrd\_this\_time);$$

where V_load_this_time is the voltage measured any time after the "battery low" warning, Tbrd_this_time is the temperature measured at the same time that V_load_this_time is measured, after the "battery low" warning, and V_ROFF( ) uses the threshold table for radio shut-off given by the results of step 320 in FIG. 3.

The battery charge current estimation method may, for example, use the estimated battery ESR and unloaded voltage in conjunction with measuring the battery terminal voltage in both the charger on state and the charger off state.

Battery charge current is estimated by first measuring the battery terminal voltage while charging (V_charge). The charger is then disabled for a short period of time to allow the unloaded battery voltage to be estimated as described above.

The unloaded voltage (V(Tbat)) and the battery terminal voltage during charging (V_charge) may be used to estimate the charge current as Ichg=(V_charge−V(Tbat))/(F_esr(Tbat)*ESR(Tbat)).

This written description uses examples to disclose the invention, including the best made, and also to enable a person skilled in the art to make and use the invention. The patentable scope of the invention may include other examples that occur to those skilled in the art. For example, the examples described above refer to mobile communication devices. However, other electronic device requiring batteries for operation may also benefit from the technology described herein.

We claim:

1. A method of estimating a usable battery capacity for a mobile device, comprising:
   measuring one or more operating condition of the mobile device;
   measuring a present loaded battery voltage of the mobile device;
   determining a present unloaded battery voltage based on the present loaded battery voltage and the one or more operating condition, wherein the present unloaded battery voltage represents a battery voltage in a completely unloaded condition;
   determining a present battery capacity using the present unloaded battery voltage;
   determining a loaded operational threshold voltage of the mobile device, the loaded operational threshold voltage being a battery voltage below which an operation of the mobile device is shut off, and at least one operation of the mobile device remains operable;
   determining an unloaded operational threshold voltage of the mobile device based on the loaded operational threshold voltage and the one or more operating condition;
   determining an operational threshold capacity using the unloaded operational threshold voltage;
   estimating the usable battery capacity based on the present battery capacity and the operational threshold capacity; and
   storing the usable battery capacity estimation in a computer-readable medium;
   wherein the usable battery capacity is estimated as a function of time.

2. The method of claim 1, wherein the usable battery capacity is an accessible capacity, and wherein the loaded operational threshold voltage is a battery voltage below which a radio in the mobile device is shut off, and at least one operation of the mobile device remains operable.

3. The method of claim 1, wherein the mobile device includes a profile table that relates a plurality of battery profile values with the one or more operating condition of the mobile device, and wherein the profile table is used to determine the present unloaded battery voltage, the present battery capacity, the unloaded operational threshold voltage and the operational threshold capacity.

4. The method of claim 1, wherein the mobile device generates a warning message if the usable battery capacity falls below a warning threshold.

5. The method of claim 1, wherein the one or more operating condition includes a battery temperature.

6. The method of claim 1, wherein the one or more operating condition includes a battery current.

7. The method of claim 1 wherein the one or more operating condition includes a transmit power of the mobile device.

8. The method of claim 1, further comprising:
   estimating a remaining operating time based on the usable battery capacity.

9. The method of claim 1, wherein the usable battery capacity is in units of current multiplied by time.

10. The method of claim 3, further comprising:
    accessing the profile table to translate the one or more operating condition into a battery profile value;
    adjusting the battery profile value by a correction factor to generate a corrected battery profile value; and
    using the corrected battery profile value to determine the present battery capacity and the operational threshold capacity.

11. The method of claim 4, wherein the warning threshold is determined as a function of a predetermined warning time period and a battery current.

12. The method of claim 10, wherein the battery profile value is an equivalent series resistance (ESR) of the battery.

13. The method of claim 11, wherein the predetermined warning time period is an amount of time before the unloaded operational threshold voltage is reached that the warning message is to be generated.

14. The method of claim 13, wherein the warning message is generated when a difference between the present battery capacity and the operational threshold capacity becomes less than a multiple of the battery current and the predetermined warning time period.

15. A method of estimating the capacity of a battery to power a predetermined feature of a battery operated device, the predetermined feature operable when the battery is above a corresponding shut off voltage, the method comprising:
    measuring a battery voltage;
    determining an unloaded battery voltage by translating the measured battery voltage to take into account a load on the battery, wherein the unloaded battery voltage represents a battery voltage in a completely unloaded condition;
    determining at least one unloaded shut off voltage by translating the shut off voltage to take into account the load on the battery;
    determining a battery capacity using the unloaded battery voltage;
    determining a shut off capacity using the unloaded shut off voltage;
    estimating an estimated capacity for the predetermined feature as a difference between the shut off capacity and the battery capacity, wherein the predetermined feature will shut off if the battery falls below the shut off capacity, and wherein at least one feature of the battery operated device will remain operational if the battery falls below the shut off capacity; and
    storing the estimated capacity in a computer-readable medium;
    wherein the estimated capacity is estimated as a function of time.

16. The method of claim 15, wherein the predetermined feature includes a radio on the battery operated device, the radio having a corresponding radio shut off voltage.

17. The method of claim 15, further comprising:
    determining a battery current delivered by the battery;
    determining a predetermined threshold capacity corresponding to a battery capacity required to continue to deliver the battery current for a predetermined amount of time; and
    comparing the estimated capacity to the predetermined threshold capacity.

18. The method of claim 15, wherein the step of determining an unloaded battery voltage by translating the measured battery voltage to take into account the load on the battery includes the step of determining at least one operating condition for the battery operated device selected from the group consisting of: determining an effective serial resistance for the battery, determining a temperature of the battery operated device, applying a correction parameter, determining the transmit power, and determining an idle state.

19. The method of claim 15, wherein the estimated capacity is in units of current multiplied by time.

20. The method of claim 17, further comprising:
identifying when the estimated capacity is less than the predetermined threshold capacity; and
in response to identifying that the estimated capacity is less than the predetermined threshold capacity, triggering a predetermined action on the battery operated device.

21. The method of claim 17, further comprising:
issuing a warning to a user of the battery operated device indicating that the predetermined feature will be shut off at a time which is substantially coincidental with the predetermined amount of time after the warning.

22. The method of claim 17, wherein the step of determining a battery current delivered by the battery occurs at the time of the estimating step.

23. The method of claim 20, wherein the predetermined action is a warning action.

24. The method of claim 20, wherein the predetermined action is displaying the estimated capacity, the estimated capacity being displayed in terms of the predetermined amount of time after which the predetermined feature will be shut off.

25. The method of claim 24, wherein the warning action is a battery low warning.

26. A mobile device, comprising:
a battery configured to power the mobile device;
one or more sensor circuits configured to measure one or more operating conditions of the battery;
a battery voltage measurement circuit configured to measure a present loaded battery voltage of the battery;
a battery capacity estimation program configured to (1) determine a present unloaded battery voltage based on the present loaded battery voltage and the one or more operating conditions of the battery, wherein the present unloaded battery voltage represents a battery voltage in a completely unloaded condition, and (2) determine a present battery capacity using the present unloaded battery voltage;
the battery capacity estimation program being further configured to (1) determine a loaded operational threshold voltage of the mobile device, the loaded operational threshold voltage being a battery voltage below which an operation of the mobile device is shut off, but at least one operation of the mobile device remains operational; (2) determine an unloaded operational threshold voltage of the mobile device based on the loaded operational threshold voltage and the one or more operating parameters, and (3) determine an operational threshold capacity using the unloaded operational threshold voltage; and
the battery capacity estimation program being further configured to estimate a usable battery capacity based on the present battery capacity and the operational threshold capacity;
wherein the usable battery capacity is estimated as a function of time.

27. The mobile device of claim 26, further comprising:
a profile table stored in one or more memory location on the mobile device and accessible by the battery capacity estimation program, the profile table relating a plurality of battery profile values with the one or more operating conditions of the mobile device;
wherein the battery capacity estimation program is configured to use the profile table to determine the present unloaded battery voltage, the present battery capacity, the unloaded operational threshold voltage and the operational threshold capacity.

28. The mobile device of claim 26, further comprising:
a radio configured to communicate via a wireless network;
wherein the loaded operational threshold voltage is a battery voltage below which the radio in the mobile device is shut off, but at least one operation of the mobile device remains operational.

29. The mobile device of claim 26, wherein the mobile device is configured to generate a warning message if the usable battery capacity falls below a warning threshold.

30. The mobile device of claim 26, wherein the one or more operating conditions includes a battery temperature.

31. The mobile device of claim 26, wherein the one or more operating conditions includes a battery current.

32. The mobile device of claim 26, wherein the one or more operating conditions includes a transmit power of the mobile device.

33. The mobile device of claim 26, wherein the usable battery capacity is in units of current multiplied by time.

34. The mobile device of claim 29, wherein the warning threshold is determined as a function of a predetermined warning time period and a battery current.

* * * * *

UNITED STATES PATENT AND TRADEMARK OFFICE
CERTIFICATE OF CORRECTION

PATENT NO. : 7,418,356 B2 Page 1 of 1
APPLICATION NO. : 10/668763
DATED : August 26, 2008
INVENTOR(S) : Jin et al.

It is certified that error appears in the above-identified patent and that said Letters Patent is hereby corrected as shown below:

Column 17, line 22, please replace "of claim 24" with -- of claim 23 --

Signed and Sealed this

Twenty-second Day of June, 2010

David J. Kappos
*Director of the United States Patent and Trademark Office*